US006875475B2

(12) United States Patent
Moran et al.

(10) Patent No.: US 6,875,475 B2
(45) Date of Patent: Apr. 5, 2005

(54) METHODS FOR PRODUCING SUBMICRON METAL LINE AND ISLAND ARRAYS

(75) Inventors: Cristin E. Moran, Houston, TX (US); Corey J. Radloff, Houston, TX (US); Naomi J. Halas, Houston, TX (US)

(73) Assignee: William Marsh Rice University, Houston, TX (US)

( * ) Notice: Subject to any disclaimer, the term of this patent is extended or adjusted under 35 U.S.C. 154(b) by 0 days.

(21) Appl. No.: 10/404,858

(22) Filed: Apr. 1, 2003

(65) Prior Publication Data

US 2004/0009298 A1 Jan. 15, 2004

Related U.S. Application Data

(60) Provisional application No. 60/369,079, filed on Apr. 1, 2002.

(51) Int. Cl.[7] .................................................. B05D 1/18
(52) U.S. Cl. ....................... 427/437; 427/304; 427/123; 427/162; 427/164; 427/443.1; 427/305
(58) Field of Search ................................. 427/123, 125, 427/162, 163.2, 304, 305, 283.1, 256, 437, 443.1, 383.1

(56) References Cited

U.S. PATENT DOCUMENTS 3,753,816 A * 8/1973 Feldstein et al. ............. 216/48
3,882,396 A * 5/1975 Schneider .................... 455/325
5,079,600 A * 1/1992 Schnur et al. ............... 257/750
5,512,131 A * 4/1996 Kumar et al. ................ 438/738
6,180,239 B1 * 1/2001 Whitesides et al. ....... 428/411.1
6,406,777 B1 * 6/2002 Boss et al. ................... 428/209
6,498,114 B1   12/2002 Amundson et al. .......... 438/780
6,521,285 B1    2/2003 Biebuyck et al. ............. 427/98
6,582,767 B1    6/2003 Fukushima et al. .......... 427/304
2003/0174384 A1 * 9/2003 Halas et al. ................. 359/296

* cited by examiner

Primary Examiner—Bret Chen
Assistant Examiner—David Turocy
(74) Attorney, Agent, or Firm—Conley Rose, P.C.

(57) ABSTRACT

This process results in directed electroless plating of the metal to form discrete metal structures over the entire surface. Because the surface is pre-patterned with passivated regions inert to metal deposition, the metal is directed only to the unstamped regions. This allows the formation of unconnected metal structures without any chemical etching steps. These metallic arrays are varied in size, separation and shape by using gratings of different periodicities and blaze angles as the stamp templates. A variety of well-defined geometric patterns have been fabricated and imaged using scanning probe, scanning electron, and optical microscopies.

13 Claims, 5 Drawing Sheets

5a

5b

5c

5d

METHODS FOR PRODUCING SUBMICRON METAL LINE AND ISLAND ARRAYS

CROSS-REFERENCE TO RELATED APPLICATIONS

This application claims the benefit of U.S. provisional patent application Ser. No. 60/369,079, filed Apr. 1, 2002, which is incorporated herein by reference in its entirety.

STATEMENT REGARDING FEDERALLY SPONSORED RESEARCH OR DEVELOPMENT

This work was supported by funding from the Army, Grant Number DAAD19-99-10315.

FIELD OF THE INVENTION

The present invention generally relates to the field of metal nanostructures. More specifically, the present invention relates to fabricating arrays of discrete metal nanostructures, which can be easily varied in size and shape and replicated over large areas, on an optically transparent substrate.

BACKGROUND OF THE INVENTION

The controlled fabrication of two and three-dimensionally ordered structures is important for the nanoengineering of materials and devices, where "nano" is loosely defined as small, typically in the range of microns or smaller. In particular, metal nanostructures are increasingly important building blocks for new materials due to their shape-dependent plasmon response and thus their tunable optical properties. The emergent field of plasmonics is particularly concerned with how surface plasmons propagate, localize, or interact on metal nano- and microstructures. Exploitation of surface plasmon propagation in these regimes can be used to develop new devices in nano-optics and optical computing, waveguides, biomolecular and chemical sensor arrays, optical filters, and surface enhanced Raman substrates (SERS).

Microcontact printing, a form of soft lithography, is a nonphotolithographic technique in which molecular patterns are transferred to surfaces using a polydimethylsiloxane (PDMS) stamp. The polymer stamp is molded from a master template, which is the relief of the desired printed pattern, and is wetted by a solution of the molecule to be transferred. This technique is fast, simple, and inexpensive and has inspired several new fabrication methods. For example, planar metal structures have been fabricated using microcontact printing wherein a pattern of protective alkanethiols is stamped onto a metal surface and chemical etching is used to remove the non-stamped regions. A second method uses a PDMS stamp to transfer palladium colloid directly to a surface onto which copper is deposited by electroless plating. Still, another method includes functionalizing a surface with molecules that attach to metal colloid. In the aforementioned method described, selective deposition of Pt and Pd can be accomplished using hexafluoroacetylacetonate complexes and Metalorganic Chemical Vapor Deposition (MOCVD).

While a number of methods exist for producing planar metal structures employing microcontact printing, methods for producing a wide variety of geometrically distinct two dimensional (2-D) arrays of metal patterns without lithographically defining a different 2-D master template for each new pattern and without the need for chemical etching are not known to exist. Hence, it is desirable to produce planar metal structures according to this desirable new method.

SUMMARY OF THE INVENTION

The present invention relates generally to methods and apparatus for fabricating planar arrays of discrete metal structures. More particularly, the present invention describes a new lithography-free and etchant-free method for fabricating planar arrays of discrete metal structures using simple materials and inexpensive techniques.

In a preferred embodiment, metal planar arrays are fabricated by exposing a substrate to hydrophobic molecules capable of bonding to the substrate, such that the substrate has hydrophobic and hydrophilic regions; exposing the substrate to a metallization precursor such that the hydrophilic regions are activated; and exposing the substrate to an electroless plating solution, thereby reducing metal onto the hydrophilic regions. In a preferred embodiment, the hydrophobic molecules capable of bonding to the substrate comprise silane molecules such as n-propyltrimethoxysilane (PTMS). The substrate is preferably a glass such as silica.

In an alternate embodiment, the molecules capable of bonding to the substrate are not hydrophobic, but rather simply "block" the substrate surface from the metallization precursor and do not react with the metallization precursor. Suitable blocking molecules include, for example, aminopropyltriethoxysilane (APTES). As used herein, "non-hydrophilic" is intended to include compositions of molecules that are hydrophobic or blocking.

The present invention comprises a combination of features and advantages that enable it to substantially improve the fabrication of planar arrays of discrete metal structures. For example, by employing passivative microcontact printing to protect areas of the substrate from further chemical reaction, long range 2-D arrays of separated metal structures are created from stamps of one dimensional (1-D) geometry. The use of multiple combinations of different diffraction gratings can produce a wide variety of metal patterns possessing a number of functional geometries. The resulting patterned metal structures may be used to study surface plasmon propagation within confined, periodic submicron dimensions. These and various other characteristics and advantages of the present invention will be readily apparent to those skilled in the art upon reading the following detailed description of the preferred embodiments of the invention and by referring to the accompanying drawings.

BRIEF DESCRIPTION OF THE DRAWINGS

For a more detailed understanding of the preferred embodiments, reference is made to the accompanying Figures, wherein.

DETAILED DESCRIPTION OF THE PREFERRED EMBODIMENTS

Figure 1:
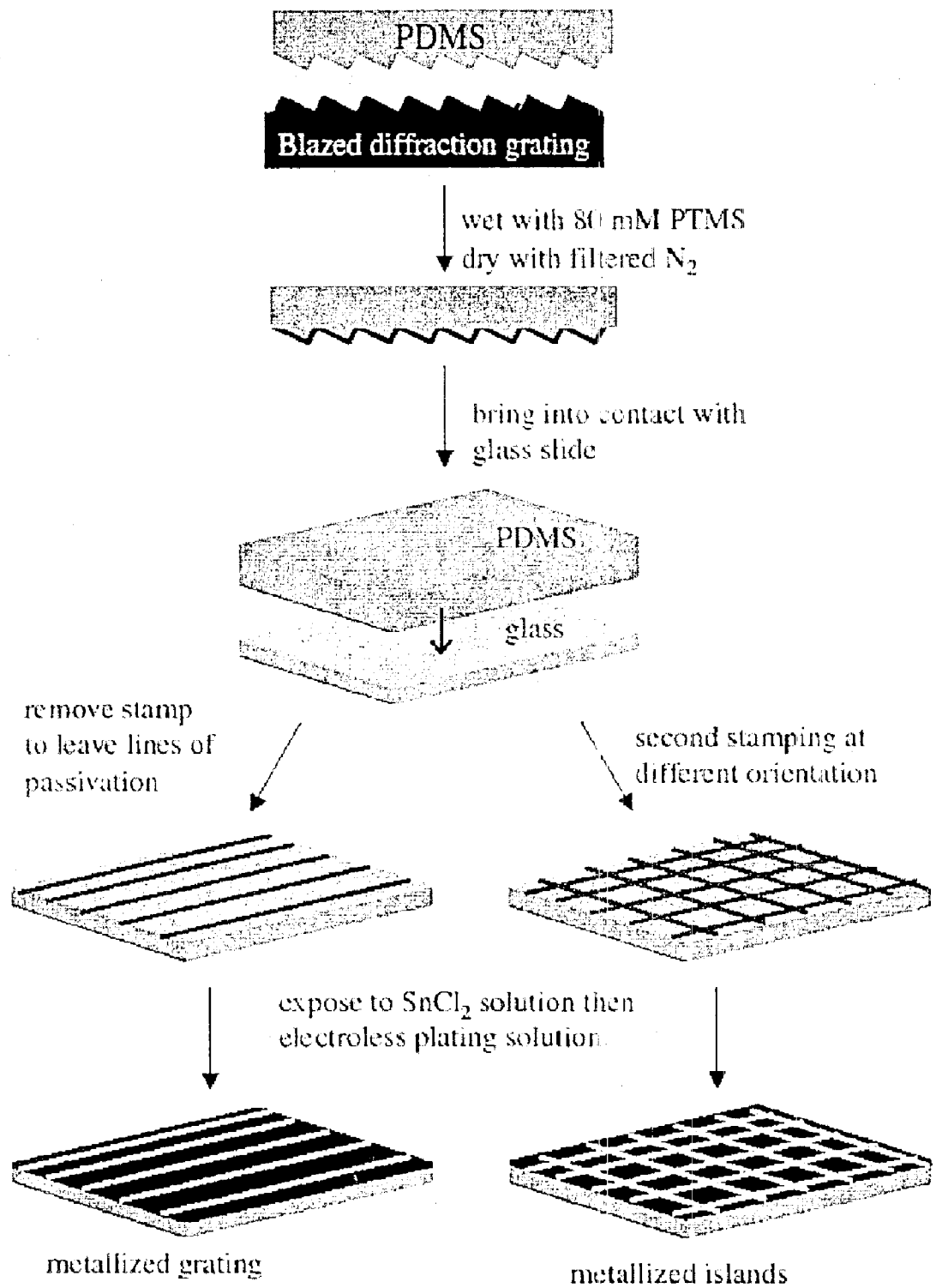
FIG. 1 is a schematic overview of a fabrication process in accordance with the principles of the present invention

In the description that follows, like parts are marked throughout the specification and drawings with the same reference numerals, respectively. The drawing figures are not necessarily to scale. Certain features of the invention may be shown exaggerated in scale or in somewhat schematic form and some details of certain elements may be omitted in the interest of clarity and conciseness.

The present invention relates to methods and apparatus for fabricating planar arrays of discrete metal structures on a substrate. The planar arrays may comprise 1-D structures such as lines or gratings or 2-D structures such as "islands." The present invention is susceptible to embodiments of different forms. There are shown in the drawings, and herein will be described in detail, specific embodiments of the present invention with the understanding that the present disclosure is to be considered an exemplification of the principles of the invention, and is not intended to limit the invention to that illustrated and described herein. It is to be fully recognized that the different teachings of the embodiments discussed below may be employed separately or in any suitable combination to produce desired results.

The present planar arrays are preferably fabricated by (i) exposing a substrate to hydrophobic molecules capable of bonding to the substrate, such that the substrate has hydrophobic and hydrophilic regions; (ii) exposing the substrate to a metallization precursor such that the hydrophilic regions are activated; and (iii) exposing the substrate to an electroless plating solution, thereby reducing metal onto the hydrophilic regions. In a preferred embodiment, the hydrophobic molecules capable of bonding to the substrate comprise silane molecules such as npropyltrimethoxysilane (PTMS). Silane molecules are herein defined as a chemical compound and a group of compounds having the general formula of $SiH_4$, also including siloxanes.

The substrate is preferably a glass such as silica. Alternately, the substrate may be a material selected from the group consisting of titanium nitride, indium tin oxide, alumina, and silicon.

The metallization precursor is preferably $Sn^{2+}$. The electroless plating solution preferably comprises a metal salt selected from the group consisting of Ag, Ni, Sn, Au, Pd, Pt, Cu, or combinations thereof.

In some embodiments, PDMS stamps molded from commercial diffraction gratings are used to deposit the hydrophobic molecules onto the substrate. Using such stamps allows well-defined patterns of hydrophobic molecules to be formed. The PDMS stamps may have any periodicity, however periods ranging from about 100 nm to 100 $\mu$m and more preferably from 417 nm (2400 grooves/mm) to 3.3 $\mu$m (300 grooves/mm) are preferred.

In alternate embodiments, the molecules may be bonded or attached to the substrate by exposing the substrate to a solution of the molecules and allowing the molecules to condense on the substrate surface.

In some embodiments, the molecules capable of bonding to the substrate are not hydrophobic, but rather simply block the substrate surface from the metallization precursor and do not react with the metallization precursor. Suitable nonhydrophobic molecules include, for example, aminopropyltriethoxysilane (APTES).

A sample preparation method as well the analysis of samples prepared according to this method follow.

Sample Preparation

Glass microscope slides were patterned with PTMS using PDMS stamps molded from both blazed and holographic diffraction gratings. Stamps were cleaned of dust or debris by rinsing in ethanol, then wetted with a fresh 0.08 M solution of PTMS in ethanol. The stamps were allowed to dry and then manually placed on the clean, dry glass substrates. The stamps were left in contact with the slides for time sufficient to allow the PTMS molecules to fully condense onto the glass surface (approximately 8–12 hours). After condensation of the PTMS, the stamps were gently peeled away and the slides were exposed to a solution of $SnCl_2$ for approximately 5–10 seconds, which activated the unstamped regions for metal reduction.

Once activated, the slides were thoroughly rinsed with water and immediately exposed to silver or gold electroless plating solutions for a period of seconds or minutes until the metal had reduced onto the activated regions of the slides to the desired thickness. Typical plating times range from 15 seconds to 1 minute. The silvering solution was used according to the provided instructions, while the gold solution was prepared by diluting 1 mL of a 1% chloroauric acid solution with 99 mL of $H_2O$ and adding 25 mg $K_2CO_3$. This solution was aged for 24 hours to allow the formation of gold hydroxide. Formaldehyde was used to reduce the gold hydroxide to gold metal onto the patterned Sn-activated substrates. After electroless plating the samples were rinsed well with water and dried with filtered nitrogen.

Sample Materials

PDMS stamps were prepared in a standard way using an elastomer kit (Sylgard 184, Dow Corning). Glass microscope slides were cleaned in piranha etch (7:3 v/v 98% $H_2SO_4$:30% $H_2O_2$) for 1 hour, rinsed in ultrapure water (Milli-Q system, Millipore) and dried with a stream of filtered $N_2$. Silver plating was accomplished using a commercially available silver plating kit (HE-300, Peacock Laboratories Inc.).

Using the aforementioned sample preparation method, silver and gold lines or gratings and 2-D island arrays were fabricated on microscope slides cut into 1 $cm^2$ pieces to match the size of the master gratings used to form the stamps. The largest area sample fabricated using this method is 2.5 cm×2.5 cm, which matched the size of the largest master grating purchased. However, it is believed that the process itself should not restrict the production of even larger samples.

The cut slides were cleaned in piranha etch solution, rinsed in ultrapure water and dried in a stream of filtered nitrogen. A schematic of the sample fabrication procedure is shown in FIG. 1. All steps in the fabrication were performed on the benchtop under ambient conditions.

Referring to FIG. 1, the PDMS grating stamps were dipped in a 0.08 M solution of PTMS in ethanol and allowed to dry. The stamps were then pressed on top of the clean glass slides and the PTMS was allowed to condense on the glass surface for several hours.

The stamp was removed by gently peeling the PDMS away from the glass. The clean stamped surface was used within a reasonably short period of time after stamp removal in order to minimize surface contamination.

To obtain 2D arrays, a second stamp was applied to the same substrate at an angle relative to the first set of stamped lines. During the application of the second stamp, additional pressure was applied to the stamp on the substrate by adding weight on top of the stamp, or by clamping the stamp to the substrate in order to ensure that the stamp touched the substrate surface. For multiply stamped substrates, the first stamp used may have a larger period than the second stamp used; this allows the features of the second stamp to come into better contact with the substrate.

PTMS contains three labile alkoxy substituents, which hydrolyze in the presence of water either in the alcoholic solution or present on the glass surface. The hydrolyzed groups then form hydrogen bonds and condense with the OH groups present on the substrate, and with each other, to form an oligomeric interconnected network. Without wishing to be bound by any particular theory, it is believed that on the stamp surface some degree of oligomerization has already begun, contributing to the non-porous property and lack of wettability of the PTMS stamped areas. This condensed PTMS formed a physical and chemical barrier between the glass surface and the aqueous metallization solutions. Due to the cross linking of individual PTMS molecules and the build up of multiple molecular layers, the printed lines were between 5–8 nm tall as determined by atomic force microscopy (AFM) images and were densely packed with hydrophobic groups. In addition, other molecules such as octadecyltrichlorosilane were stamped from a hexane solution, but the stamped lines (not shown) formed in this manner were more permissive to the aqueous metallization solutions reaching the glass surface.

Figure 2:
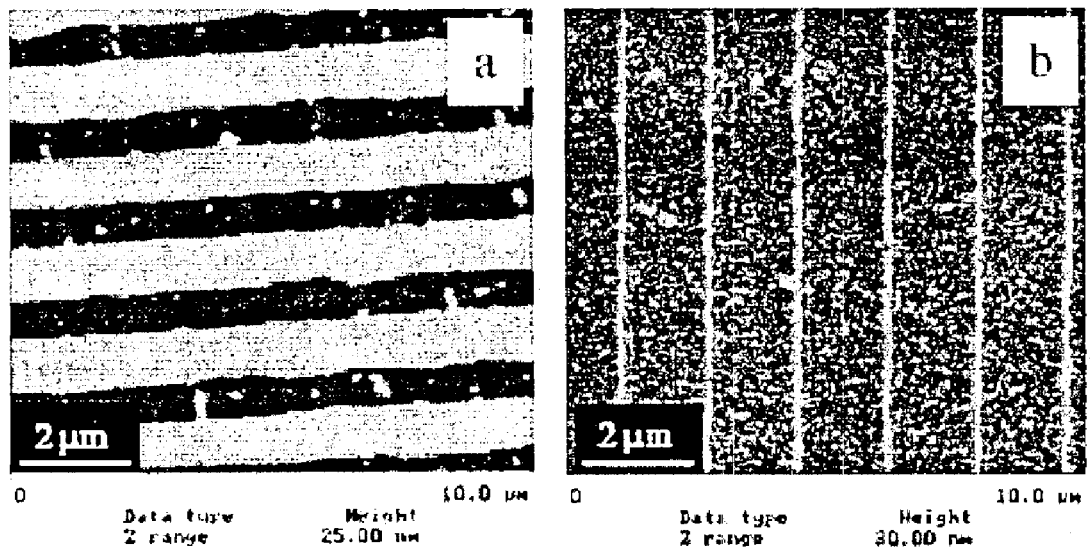
FIGS. 2a and 2b are AFM images of PTMS lines stamped onto glass substrates where (a) period=1.6 $\mu$m, blaze angle=28° and (b) period=1.61 $\mu$m, blaze angle=4°.

AFM images of PTMS lines printed on glass substrates are shown in FIGS. 2a and 2b. Both gratings have the same 1.6 $\mu$m period, but the blaze angle of the grating stamp used in FIG. 2a was 28° while the blaze angle used in FIG. 2b was only 40°. Blaze angle is herein defined as, in a stamp, the angle between the operating facet of the grooves and the overall grating. Given the same periodicity, the grating with the higher aspect ratio features will compress more, printing wider lines, than a grating with shorter features.

Figure 3:
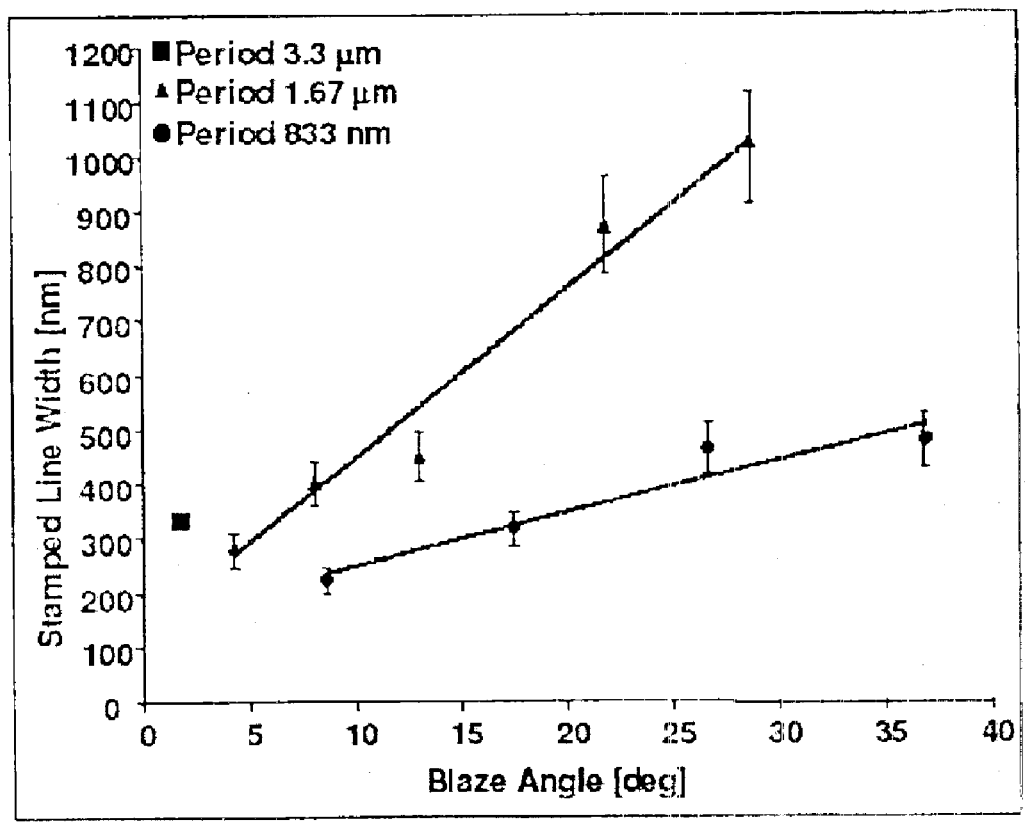
FIG. 3 is a graph showing the relationship between printed PTMS line width and blaze angle of the stamp.

FIG. 3 shows a plot of the printed line width of PTMS and the blaze angle of the various grating stamps used. Each data point is an average of line widths from several areas on different samples. In FIG. 3, there are two noticeable trends: first, as blaze angle is increased for a given grating period the printed lines become wider, and second, as the grating period decreases from 3.3 $\mu$m to 833 nm the minimum line width able to be printed decreases. For example, a grating with a period of 3.3 $\mu$m and a blaze angle of only 2° prints a line of PTMS approximately 100 nm wider than a grating with an 833 nm period and a blaze angle of 8°. This trend can be explained by comparing the lateral forces constraining the deformation of the PDMS features of different period gratings, and noting that although the absolute feature height for these two gratings is almost equal, the aspect ratio of the features is not; the material properties of PDMS remain the same in both cases, but the degree of compression depends on the overall width of the stamp features. Though PDMS stamp deformation during microcontact printing is usually considered undesirable, here the elasticity was used to control the printed line width and thus the eventual geometry of the metal structures. It is recognized that there is variation in the printed width of the PTMS lines from point to point on a given sample. This variation may be due to a plurality of factors including defects in the master grating, which result in defects in the stamp.

A traditional method of preparing glass surfaces for electroless metal reduction is by activation using a metallization precursor such as $Sn^{2+}$. This method catalyzes the metal reduction to take place at the surface of the substrate and has recently been used to fabricate metal-coated silica colloids. This treatment can be accomplished by preparing a solution that is 0.026 M $SnCl_2$ and 0.07 M trifluoroacetic acid in a solvent mixture that is 50/50 methanol/water or by using a commercially available sensitizing solution.

Using $Sn^{2+}$ as a metallization precursor, Sn(II) was adsorbed through electrostatic interactions to the bare glass surface. Exposing the alkoxysilane-stamped glass substrate to a solution of $SnCl_2$ activated the non-stamped areas for further metal deposition. The sample was rinsed well with water and the Sn(II)-sensitized surface was exposed to an aqueous electroless plating solution containing $Ag^+$ ions. At the surface, a redox reaction took place in which the bound Sn(II) was oxidized to Sn(IV) and the $Ag^+$ ions were reduced to a thin layer of Ag metal. Further metal was reduced onto this thin layer by the reducing agent present in the plating solution.

In the case of gold reduction, the plating bath comprised a solution of gold hydroxide and formaldehyde. The formaldehyde was used to plate more metal onto the thin layer of gold initially reduced by the Sn(II). In each case, the metal reduced specifically onto the Sn-functionalized areas allowing the directed reduction and growth of discrete submicron metal lines or metal islands. The widths of the metal gratings, and the shapes and sizes of the metal islands may be controlled by varying the grating dimensions of the stamps used to passivate the substrate.

Figure 4:
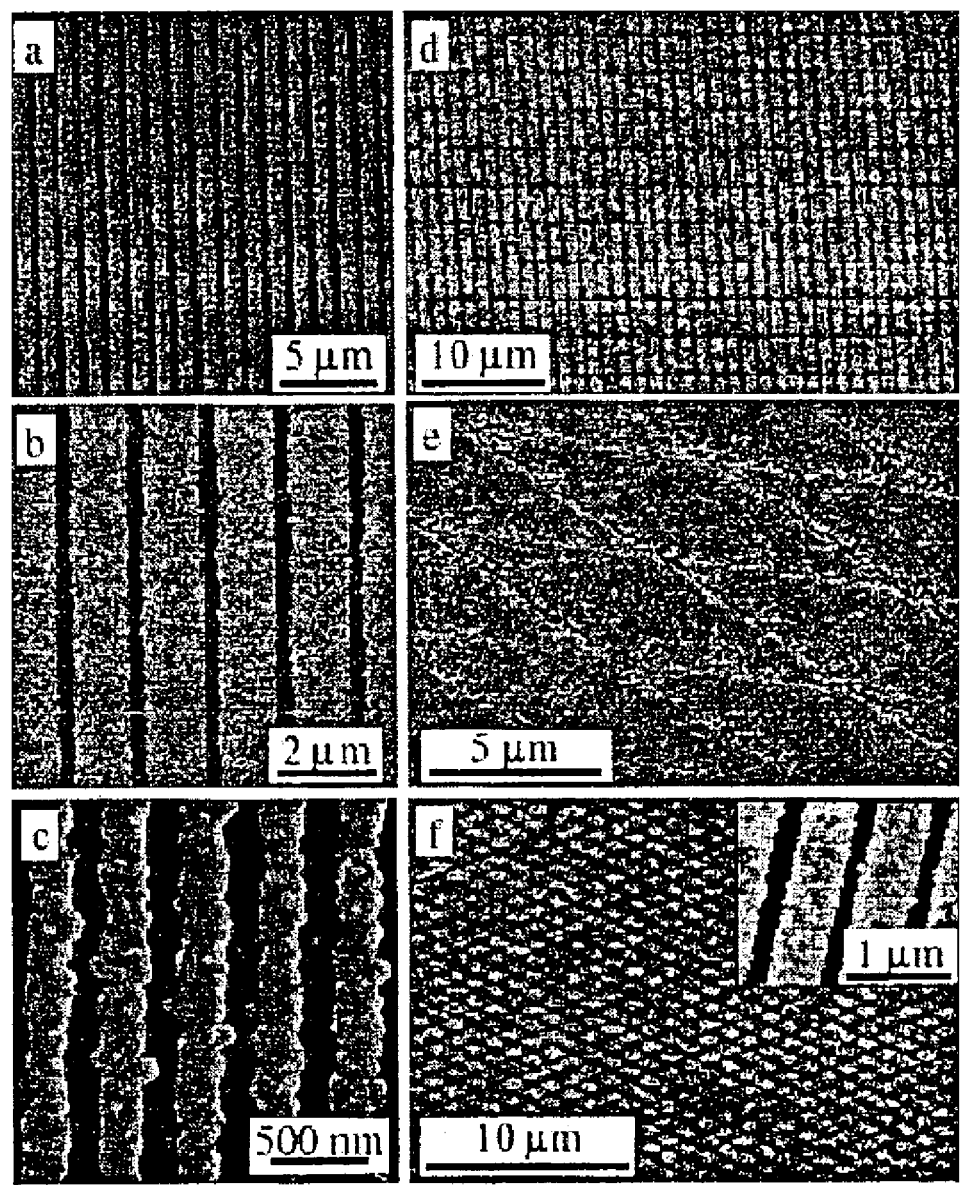
FIGS. 4a–4f are SEM images of metal lines and islands on glass substrates where (a) period=1.2 $\mu$m, blaze angle=19°; (b) period=1.6 $\mu$m, blaze angle=13°; (c) period=417 nm, holographic grating; (d) period 1=3.3 $\mu$m, blaze angle 1=2°, period 2=1.2 $\mu$m, blaze angle 2=19°; (e) period 1=3.3 $\mu$m, blaze angle 1=2°, period 2=3.3 $\mu$m, blaze angle 2=2°; and (f) period 1=833 nm, blaze angle 1=36°, period 2=833 nm, blaze angle 2=36°.

Scanning electron microscopy was used to image a variety of metallized surfaces as shown in FIG. 4. FIGS. 4a–4c show arrays of metal lines of various widths and periodicities. FIGS. 4d–4f show metal islands of various dimensions fabricated by stamping either twice with the same stamp (4e, 4f) or using two different stamps (4d).

The lines or islands were generally grown between approximately 30 nm tall for a very short exposure to the plating bath (approximately 5–10 sec) to approximately 100 nm tall for a longer exposure. Two to three short exposures (approximately 5–10 seconds each) to fresh electroless plating solutions can produce lines that are more dense, but not taller than those deposited during one long exposure. The smallest metal lines made using this process were approximately 150 nm wide using a stamp molded from a holographic grating with a period of 417 nm, while the largest metal lines were approximately 3 $\mu$m wide, using a stamp molded from a grating with a period of 3.3 mm and a blaze angle of 2°. Due to the nature of the reduction chemistry, the metal wires are rough, indicating that the metallization may be occurring at discrete Sn(II)-sensitized sites, which then coalesce as electroless plating proceeds.

The silver tended to plate faster and more smoothly than the gold, and there is a clear difference between the roughness of the gold and silver samples. The samples shown in Figures 4a–4e are silver. In comparison, FIG. 4f shows gold islands, with the inset showing a different sample of gold lines. The patterns are robust and continuous over the entire stamped area and limited only by the size of the grating used to generate the stamp.

While PTMS has been described as a preferred hydrophobic molecule, any molecule, which is substantially inert to the electroless plating solution and which is capable of bonding to the substrate may be used. Furthermore, in some embodiments, the hydrophobic molecules may be removed from the substrate by methods known to one skilled in the art, such as etching in an acid or base solution. Upon removal of the hydrophobic molecules, it is contemplated that additional metals may be reduced onto the substrate where the hydrophobic molecules had previously been, as shown in FIG. 5.

Figure 5:
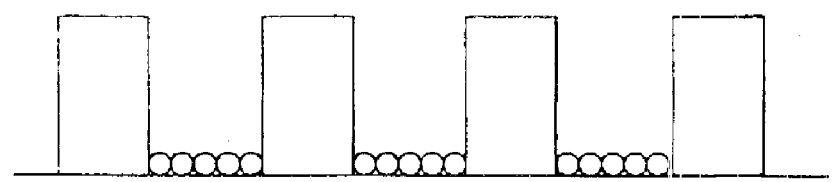
FIGS. 5a–5d are cross-sectional views of arrays made in accordance with the principles of the present invention.
Figure 5:
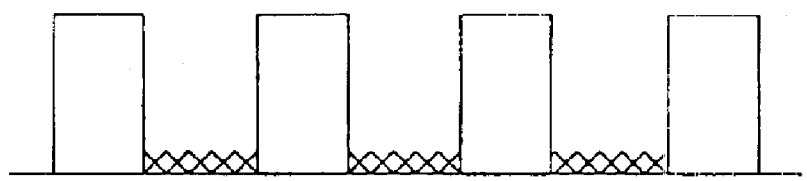
Figure 5:
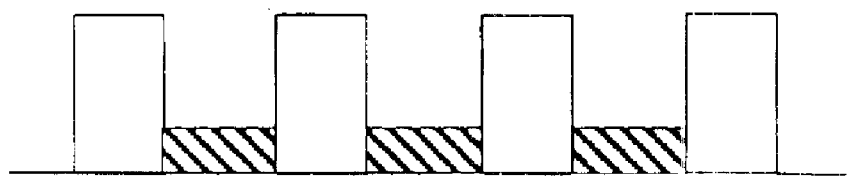
Figure 5:
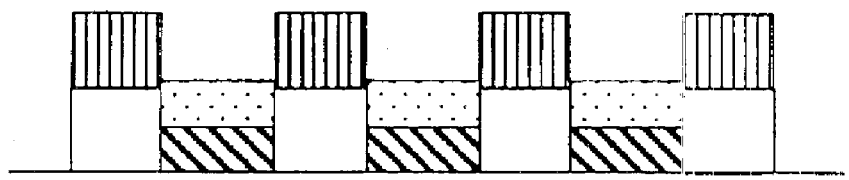

FIG. 5 shows cross-sectional views of possible arrays made in accordance with principles of the present invention. For example, FIG. 5a shows 2-D islands and hydrophobic molecules attached to a substrate. FIG. 5b shows 2-D islands attached to the substrate, where the hydrophobic molecules have been removed from the substrate. FIG. 5c shows two different types of 2-D islands on a substrate. FIG. 5d shows four different types of 2-D islands on a substrate, where two first generation types of islands were grown on the substrate and two second generation types of islands were grown on top of the first generation islands. As is evident from FIGS. 5c and 5d, any number of islands may be grown in a variety of configurations (e.g. side-by-side, stacked, overlapping, etc.) by strategically stamping or masking off regions with hydrophobic molecules.

As described above, metal nanostructures made according to the principles of the present invention find use in a variety of different applications, including components (such as optical waveguides and optical filters) manipulatable by applied static or frequency dependent optical fields. Additionally, substrates having metal nanostructures made according to the principles of the present invention may be used as surface enhanced Raman substrates (SERS), where the electromagnetic (EM) field around the metal nanostructures may be increased by selective excitation of surface plasmon waves.

The embodiments set forth herein are merely illustrative and do not limit the scope of the invention or the details therein. It will be appreciated that many other modifications and improvements to the disclosure herein may be made without departing from the scope of the invention or the inventive concepts herein disclosed. For example, while the substrate has been described as optically transparent, it is contemplated that the substrate need not be optically transparent (e.g. using a silicon wafer as a substrate). Because many varying and different embodiments may be made within the scope of the inventive concept herein taught, including equivalent structures or materials hereafter thought of, and because many modifications may be made in the embodiments herein detailed in accordance with the descriptive requirements of the law, it is to be understood that the details herein are to be interpreted as illustrative and not in a limiting sense.

What is claimed is:

1. A method for fabricating planar metal structures on a substrate comprising:

(a) exposing the substrate to hydrophilic silane molecules capable of bonding to the substrate such that the substrate has at least one hydrophobic and at least one hydrophilic region;
   (b) exposing the substrate to a metallization precursor such that the hydrophilic regions are activated; and
   (c) exposing the substrate to an electroless plating solution, thereby reducing metal onto the hydrophilic regions;
   wherein steps (a) through (c) are carried out such that only the metallization precursor layer present between the metal and the substrate.

2. The method according to claim 1 further comprising rinsing the substrate after step (b).

3. The method according to claim 1 further comprising rinsing the substrate after step (c).

4. The method according to claim 3 further comprising drying the substrate.

5. The method according to claim 1 wherein the hydrophobic molecules are capable of crosslinking with each other.

6. The method according to claim 1 wherein the silane molecules comprise n-propyltrimethoxysilane (PTMS).

7. The method according to claim 1 wherein the substrate comprises a material selected from the group consisting of titanium nitride, indium tin oxide, alumina, silicon, and silicon-based materials.

8. The method according to claim 7 wherein the substrate comprises an optically transparent material.

9. The method according to claim 8 wherein the substrate comprises silica.

10. The method according to claim 1 wherein the non-hydrophilic regions are inert to metal deposition.

11. The method according to claim 1 wherein the metallization precursor comprises $Sn^{2+}$.

12. The method according to claim 1 wherein the electroless plating solution comprises a metal salt selected from the group consisting of Ag, Ni, Sn, Au, Pd, Pt, and Cu.

13. The method according to claim 1, wherein step a) is carried out by printing with a stamp and wherein step a) is carried out at least twice before step c) is carried out.

* * * * *